United States Patent
Chen et al.

(10) Patent No.: US 10,263,056 B2
(45) Date of Patent: Apr. 16, 2019

(54) ARRAY SUBSTRATE, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Peng Chen, Beijing (CN); Xinxia Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 42 days.

(21) Appl. No.: 15/210,078

(22) Filed: Jul. 14, 2016

(65) Prior Publication Data
US 2017/0117341 A1 Apr. 27, 2017

(30) Foreign Application Priority Data

Oct. 21, 2015 (CN) .......................... 2015 1 0688386

(51) Int. Cl.
| G11C 19/18 | (2006.01) |
| G11C 19/28 | (2006.01) |
| H01L 27/32 | (2006.01) |
| G09G 3/3258 | (2016.01) |
| G09G 3/3266 | (2016.01) |
| G09G 3/3291 | (2016.01) |

(52) U.S. Cl.
CPC ....... *H01L 27/3248* (2013.01); *G09G 3/3258* (2013.01); *G09G 3/3291* (2013.01);
(Continued)

(58) Field of Classification Search
CPC .. G09G 3/3266; G09G 3/3258; G09G 3/2085; G09G 2310/0286;
(Continued)

(56) References Cited

U.S. PATENT DOCUMENTS

| 4,368,467 A * | 1/1983 | Unotoro ................... G09F 9/35 |
| | | 313/500 |
| 2010/0309179 A1* | 12/2010 | Missbach ................. G03H 1/02 |
| | | 345/205 |

(Continued)

FOREIGN PATENT DOCUMENTS

| CN | 102983132 A | 3/2013 |
| CN | 104238214 A | 12/2014 |

(Continued)

OTHER PUBLICATIONS

First Office Action dated Mar. 1, 2017 in corresponding Chinese Application No. 201510688386.4.

(Continued)

*Primary Examiner* — Nitin Patel
*Assistant Examiner* — Amen Bogale
(74) *Attorney, Agent, or Firm* — Nath, Goldberg & Meyer; Joshua B. Goldberg

(57) ABSTRACT

The present disclosure provides an array substrate, a display panel and a display device. The array substrate comprises: a plurality of pixel units arranged in rows and columns; and a plurality of cascaded shift register units, the plurality of shift register units and the rows of pixel units having one-to-one correspondence therebetween. The shift register unit comprises a plurality of shift register elements, and for each shift register unit, at least one shift register element in the shift register unit is provided within at least one pixel unit among the row of pixel units corresponding to the shift register unit. A width of a non-display region occupied by the shift register units of the present disclosure is reduced, which is beneficial to realization of a narrow bezel.

17 Claims, 2 Drawing Sheets

(52) U.S. Cl.
CPC ......... *G11C 19/184* (2013.01); *G09G 3/3266* (2013.01); *G09G 2300/0809* (2013.01); *G09G 2310/0202* (2013.01); *G09G 2310/0286* (2013.01); *G09G 2310/062* (2013.01); *G11C 19/28* (2013.01)

(58) Field of Classification Search
CPC ... G09G 2300/0809; G09G 2300/0408; G09G 2300/0426; G09G 3/0408; G09G 3/3208
See application file for complete search history.

(56) References Cited

U.S. PATENT DOCUMENTS

| | | | | |
|---|---|---|---|---|
| 2012/0249492 | A1* | 10/2012 | Kim | G09G 3/3648 345/204 |
| 2013/0100006 | A1 | 4/2013 | Lin et al. | |
| 2013/0321499 | A1* | 12/2013 | Park | G09G 3/20 345/698 |
| 2015/0287392 | A1* | 10/2015 | Kim | H03K 17/693 345/213 |
| 2016/0329021 | A1 | 11/2016 | Nagayama et al. | |
| 2016/0358551 | A1 | 12/2016 | Nagayama et al. | |

FOREIGN PATENT DOCUMENTS

| | | |
|---|---|---|
| CN | 104485085 A | 4/2015 |
| CN | 104517564 A | 4/2015 |
| CN | 104934005 A | 9/2015 |

OTHER PUBLICATIONS

Second Office Action dated Aug. 16, 2017 corresponding to Chinese application No. 201510688386.4.

* cited by examiner

ARRAY SUBSTRATE, DISPLAY PANEL AND DISPLAY DEVICE

TECHNICAL FIELD

The present disclosure relates to the field of display technology, and in particular relates to an array substrate, a display panel including the array substrate and a display device including the display panel.

BACKGROUND

As shown in FIG. 1, an existing array substrate may include a display region 100 and a non-display region 200, wherein the display region 100 has a plurality of pixel units 101 defined by a plurality of gate lines and a plurality of data lines. Gate Driver On Array (GOA) technology is a technique in which a gate driving circuit is provided in the non-display region of an array substrate. The gate driving circuit includes a plurality of cascaded shift register units and signal lines for providing signals such as a clock signal and a frame start signal. When the gate driving circuit is fabricated in the non-display region of the array substrate, the plurality of signal lines and the plurality of shift register units need to occupy some space, causing a width of the non-display region to increase, thereby affecting the realization of a narrow bezel.

SUMMARY

The objective of the present disclosure is to provide an array substrate, a display panel and a display device to realize a narrow bezel.

In order to realize the above objective, the present disclosure provides an array substrate, comprising: a plurality of pixel units arranged in rows and columns; and a plurality of cascaded shift register units, the plurality of shift register units and the rows of pixel units having one-to-one correspondence therebetween, wherein the shift register unit comprises a plurality of shift register elements, and for each shift register unit, at least one shift register element in the shift register unit is provided within at least one pixel unit among the row of pixel units corresponding to the shift register unit.

Optionally, for each shift register unit, all the shift register elements in the shift register units are provided within at least one pixel unit among the row of pixel units corresponding to the shift register unit.

Optionally, a number of the shift register elements provided within a same pixel unit is at most two.

Optionally, an organic electroluminescent device is provided in the pixel unit, the shift register element(s) provided within the pixel unit is provided beneath an anode layer of the organic electroluminescent device.

Optionally, the array substrate further comprises a plurality of signal lines for providing signals to the shift register units, wherein at least one of the signal lines is provided in a display region of the array substrate, and the signal lines are insulated and spaced apart from gate lines of the display region.

Optionally, the signal lines and data lines of the display region are provided in a same layer, the signal lines do not intersect with the data lines, and at most two of the signal lines are provided between any two adjacent data lines.

Optionally, the plurality of shift register elements of the shift register unit comprise an input transistor, a pull-up transistor, a storage capacitor, a pull-down transistor and a pull-down control transistor, and the input transistor, the pull-up transistor, the pull-down transistor and a pull-down control transistor are respectively provided within different pixel units.

Optionally, in a N-th stage shift register unit, a second electrode of the input transistor is connected with a first terminal of the storage capacitor; a gate of the pull-up transistor is connected with the first terminal of the storage capacitor, a first electrode of the pull-up transistor is connected with a clock signal input terminal of the shift register unit, and a second electrode of the pull-up transistor is connected with a N-th gate line of a display region; a second terminal of the storage capacitor is connected with the N-th gate line; a first electrode of the pull-down transistor is connected with the N-th gate line, and a second electrode of the pull-down transistor is connected with a low level input terminal of the shift register unit; a first electrode of the pull-down control transistor is connected with the first terminal of the storage capacitor, and a second electrode of the pull-down control transistor is connected with the low level input terminal of the shift register unit; wherein N is a positive integer, and when N=1, in a first stage shift register unit, a gate and a first electrode of the input transistor are connected with a frame start signal line for proving a frame start signal, and a gate of the pull-down transistor and a gate of the pull-down control transistor are both connected with a second gate line;

when N is an integer greater than 1 and smaller than a total number of the shift register units, in the N-th stage shift register unit, the gate and the first electrode of the input transistor are connected with a (N−1)-th gate line, and the gate of the pull-down transistor and the gate of the pull-down control transistor are both connected with a (N+1)-th gate line;

when N equals the total number of the shift register units, in the N-th stage shift register unit, the gate and the first electrode of the input transistor are connected with a (N−1)-th gate line, and the gate of the pull-down transistor and the gate of the pull-down control transistor are both connected with a reset signal line for providing a reset signal to the N-th stage shift register unit.

Accordingly, the present disclosure further provides a display panel, comprising the above array substrate provided by the present disclosure.

Optionally, an organic electroluminescent device is provided in the pixel unit, the shift register element(s) is provided within the pixel unit located beneath an anode layer of the organic electroluminescent device; the display panel further comprises a packaging layer covering the array substrate and a cover plate provided on the packaging layer.

Accordingly, the present disclosure further provides a display device, comprising the above display panel provided by the present disclosure.

In the present disclosure, at least one shift register element of the shift register unit is provided within the pixel unit(s), that is, at least one shift register element of the shift register unit is provided within the display region, so as to reduce a width of the non-display region that is occupied, thereby realizing a narrow bezel. In addition, the array substrate of the present disclosure is organic light emitting array substrate, and an organic electroluminescent device is provided in the pixel unit. When the shift register element(s) provided within the pixel unit are located beneath an anode layer of the organic electroluminescent device, light emitted by the organic electroluminescent device will not be blocked, so as to prevent an aperture opening ratio from being affected.

BRIEF DESCRIPTION OF THE FIGURES

The accompanying drawings, which constitute a part of the specification, are provided for further understanding of the present disclosure, and for explaining the present disclosure along with the following specific implementations, but not intended to limit the present disclosure, in which.

DETAILED DESCRIPTION

The specific implementations of the present disclosure will be described in detail below in conjunction with the drawings. It should be understood that specific implementations to be described herein are merely used for illustrating and interpreting the present disclosure and not for limiting the present disclosure.

Figure 1:
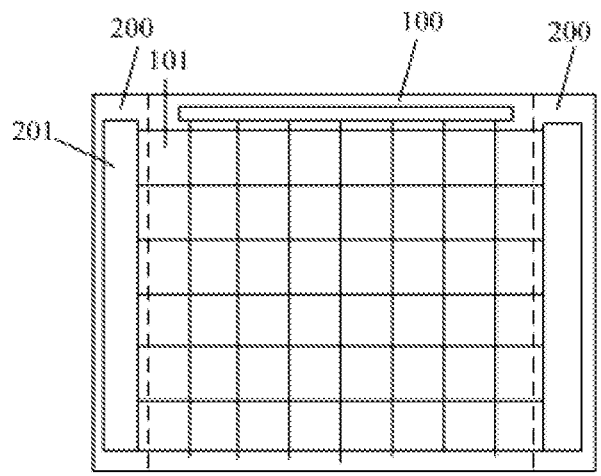
FIG. 1 is a schematic diagram of a structure of an array substrate in the prior art.
Figure 2:
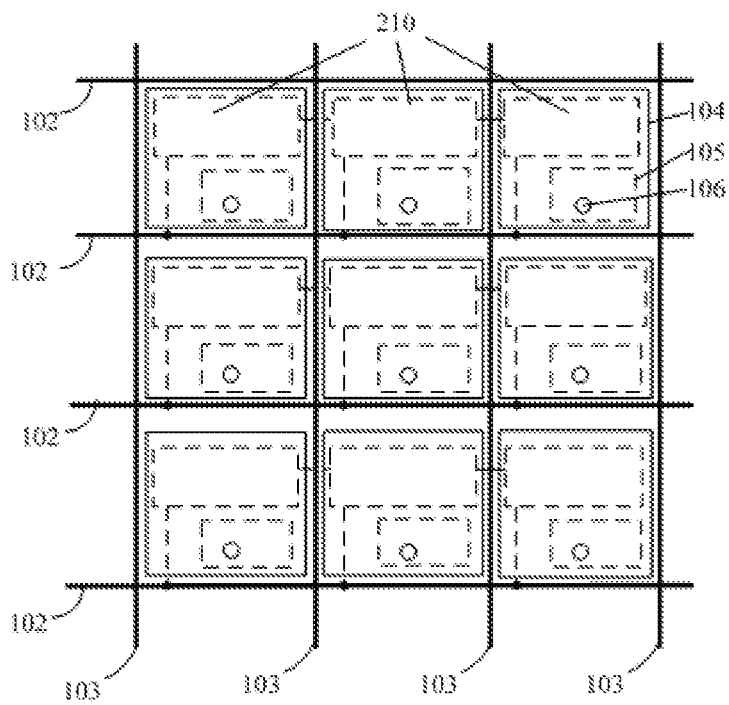
FIG. 2 is a schematic diagram of a structure of an array substrate provided in one or more embodiments of the present disclosure.
Figure 3:
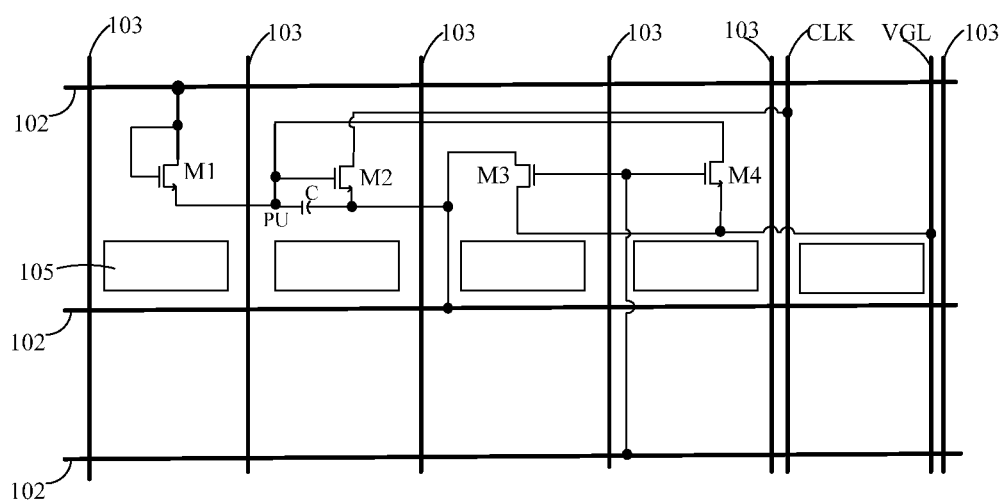
FIG. 3 is a schematic diagram of a manner in which shift register units are provided within pixel units in an embodiment of the present disclosure.

As an aspect of the present disclosure, there is provided an array substrate, as shown in FIG. 2 and FIG. 3, the array substrate includes a plurality of pixel units arranged in rows and columns, which may be defined by gate lines 102 and data lines 103, for example. The array substrate also includes a plurality of cascaded shift register units 210, and the plurality of shift register units and the rows of pixel units have one-to-one correspondence therebetween, that is, one shift register unit corresponds to one row of pixel units. The shift register unit 210 includes a plurality of shift register elements, and for each shift register unit 210, at least one shift register element in the shift register unit 210 is provided within at least one pixel unit among the row of pixel units corresponding to the shift register unit.

Each shift register unit 210 is formed of a plurality of shift register elements (such as a thin film transistor and a storage capacitor) connected to each other, for example, the plurality of shift register elements include four thin film transistors and one storage capacitor; alternatively, the plurality of shift register elements include ten thin film transistors and one storage capacitor; alternatively, the plurality of shift register elements include twelve thin film transistors and one storage capacitor; and so forth.

Generally, an array substrate can be divided into a display region and a non-display region, and pixel units are provided in the display region. In the prior art, the plurality of shift register units 210 are provided in the non-display region surrounding the display region, which leads to an increased width of the non-display region and a relatively wide bezel of a display device. While in the present disclosure, at least one shift register element of the shift register unit 210 is provided within the pixel unit(s), that is, at least one shift register element of the shift register unit 210 is provided within the display region, so as to reduce the width of the non-display region that is occupied, thereby realizing a narrow bezel.

Optionally, for each shift register unit 210, all the shift register elements in the shift register unit 210 are provided within at least one pixel unit among the row of pixel units corresponding to the shift register unit. The plurality of shift register elements of one shift register unit 210 may be provided in one pixel unit, or may also be located in multiple pixel units, such that the shift register units 210 no longer occupy space of the non-display region.

Since the space of each pixel unit is limited, a number of the shift register elements provided within a same pixel unit may be smaller than or equal to two, to prevent the shift register elements from occupying too much space in the pixel unit, which is beneficial to realizing a high resolution display.

In order to prevent the shift register elements from affecting an aperture opening ratio when provided in the pixel units, the array substrate in the present disclosure is preferably an organic light emitting device (OLED) array substrate. Specifically, as shown in FIG. 2 and FIG. 3, the pixel unit is provided therein with an organic electroluminescent device. An anode layer 104 of the organic electroluminescent device may spread across about 100% of an area of the pixel unit. The shift register elements provided within the pixel unit are located beneath the anode layer 104 of the organic electroluminescent device, that is, located beneath anode layer 104 in a direction of a thickness of the array substrate. The organic electroluminescent device may be a top luminous organic light emitting diode, and when the shift register elements are provided beneath the anode layer 104 of the organic electroluminescent device, light emitted by the organic electroluminescent device will not be blocked, such that an influence on the aperture opening ratio is prevented. Of course, the shift register elements may also be provided at other positions within the pixel unit, as long as the light emitted by the organic electroluminescent device can be prevented from being blocked.

In the present disclosure, no limitation is placed upon a structure of a pixel circuit 105 for driving the organic electroluminescent device, as long as the circuit can control the organic electroluminescent device to be turned on and to provide a driving current. For example, the pixel circuit includes a driving transistor, a writing transistor and a storage capacitor. As shown in FIG. 2, the pixel circuit 105 may also be provided beneath the anode layer 104 of the organic electroluminescent device, that is, provided beneath the anode layer 104 in a direction of the thickness of the array substrate. The anode layer 104 is connected with the pixel circuit 105 by a through hole 106. Of course, the pixel circuit 105 may also be provided at any other suitable position.

The array substrate also includes a plurality of signal lines for providing signals to the shift register units 210, such as a clock signal line, a low level signal line, a high level signal line and the like. The plurality of signal lines may be provided in the non-display region, or provided in the display region. Due to relatively narrow widths of the signal lines, there will not be too much space occupied, even if the plurality of signal lines are provided in the non-display region. In order to further reduce the width of the bezel, in the present disclosure, at least one of the signal lines is provided in the display region of the array substrate, and is insulated and spaced apart from gate lines of the display region, for example, spaced apart from the gate lines by a gate insulting layer.

Specifically, for any one signal line provided in the display region, the signal line may be provided between two adjacent data lines; or may also be provided above or below a layer in which a data line is located, and a projection of the signal line and a projection of the data line on the array substrate coincide with each other.

Optionally, the signal lines and the data lines 103 are provided in a same layer, and the signal lines do not intersect with the data lines 103, such that during the fabrication of the array substrate, the signal lines and the data lines 103 can be fabricated by a single patterning process, thereby simplifying the fabrication process. In this case, at most two signal lines are provided between any two adjacent data lines 103, to avoid the influence on the aperture opening ratio of a column of pixel units between the two adjacent data lines due to too many signal lines therebetween. When two of the signal lines are provided between two adjacent data lines 103, one of the signal lines should be close to one of the data lines, and the other of the signal lines should be close to the other of the data lines.

As described above, the shift register unit may include four thin film transistors and one storage capacitor, specifically, as shown in FIG. 3, the plurality of shift register elements of the shift register unit 210 include an input transistor M1, a pull-up transistor M2, a storage capacitor C, a pull-down transistor M3 and a pull-down control transistor M4, and the input transistor M1, the pull-up transistor M2, the pull-down transistor M3 and a pull-down control transistor M4 are respectively provided within different pixel units.

Specifically, as shown in FIG. 3, in a shift register unit of N-th stage, a second electrode of the input transistor M1 is connected with a first terminal of the storage capacitor C (pull-up node PU); a gate of the pull-up transistor M2 is connected with the first terminal of the storage capacitor C, a first electrode of the pull-up transistor M2 is connected with a clock signal input terminal of the shift register unit, and a second electrode of the pull-up transistor M2 is connected with a N-th gate line; a second terminal of the storage capacitor C is connected with the N-th gate line; a first electrode of the pull-down transistor M3 is connected with the N-th gate line, and a second electrode of the pull-down transistor M3 is connected with a low level input terminal of the shift register unit; a first electrode of the pull-down control transistor M4 is connected with the first terminal of the storage capacitor C, and a second electrode of the pull-down control transistor M4 is connected with the low level input terminal of the shift register unit; wherein N is a positive integer, and:

when N=1, that is, in a first stage shift register unit, a gate and a first electrode of the input transistor M1 are connected with a frame start signal line for proving a frame start signal, and a gate of the pull-down transistor M3 and a gate of the pull-down control transistor M4 are both connected with a second gate line;

when N is an integer greater than 1 and smaller than a total number of the shift register units 210, in the N-th stage shift register unit, the gate and the first electrode of the input transistor M1 are connected with a (N−1)-th gate line, the gate of the pull-down transistor M3 is connected with a (N+1)-th gate line, and the gate of the pull-down control transistor M4 is connected with the (N+1)-th gate line;

when N equals the total number of the shift register units, in the N-th stage shift register unit, the gate and the first electrode of the input transistor M1 are connected with a (N−1)-th gate line, the gate of the pull-down transistor M3 is connected with a reset signal line for providing a reset signal to the N-th stage (the last stage) shift register unit, and the gate of the pull-down control transistor M4 is also connected with the reset signal line.

The storage capacitor C and the pull-up transistor M2 may be provided in one same pixel unit (as shown in FIG. 3), or may be provided in different pixel units.

The plurality of signal lines on the array substrate may include a low level signal line VGL, a clock signal line CLK, a frame start signal line and a reset signal line. A low level input terminal of the shift register unit is connected with the low level signal line VGL, and a clock signal input terminal of the shift register unit is connected with the clock signal line CLK. The reset signal line is a signal line arranged after the last gate line, and may be provided parallel to the gate lines.

An operation process of the N-th stage shift register unit may be divided into a first period, a second period, and a third period. In the first period, the clock signal line CLK provides a low level signal, and a high level signal is received at the (N−1)-th gate line, such that the input transistor M1 of the N-th stage shift register unit is turned on, the pull-up node PU is charged to a high level, the pull-up transistor M2 is turned on, and the low level signal at the clock signal line CLK is outputted to the N-th gate line; in the second period, the clock signal line CLK provides a high level signal, the voltage of the pull-up node PU is further pulled up, the pull-up transistor M2 is turned on, and the high level signal at the clock signal line CLK is outputted to the N-th gate line; in the third period, the gate of the pull-down transistor M3 and the gate of the pull-down control transistor M4 receive high level signals to turn the pull-down transistor M3 and the pull-down control transistor M4 on, such that voltages of the pull-up node PU and the N-th gate line are pulled down to a low level.

When the N-th stage shift register unit outputs a high level signal to the N-th gate line, the gate and the first electrode of the input transistor M1 in the (N+1)-th stage shift register unit receive a high level signal at the same time; when the (N+1)-th stage shift register unit outputs a high level signal to the (N+1)-th gate line, the gate of the pull-down transistor M3 and the gate of the pull-down control transistor M4 of the N-th stage shift register unit receive a high level signal.

Of course, the shift register unit may also be of any other structure, as long as it can provide scanning signals sequentially to the gate lines.

In the array substrate provided by the present disclosure, since at least one shift register element of the shift register unit is provided within at least one pixel unit among the row of pixel units corresponding to the shift register unit, therefore, the width of the non-display region of the array substrate occupied by the shift register unit is reduced, which is beneficial to realizing a narrow bezel. When the plurality of shift register elements in the shift register unit are all provided within one or more pixel units, the width of the non-display region may be further reduced. In addition, the array substrate is an organic light emitting array substrate, which includes an organic electroluminescent device. When the organic electroluminescent device is top luminous, light will not pass through the shift register elements provided in the pixel unit, thus the aperture opening ratio will not be affected.

As another aspect of the present disclosure, there is provided a display panel comprising the above array substrate provided by the present disclosure.

As described above, in order to prevent the aperture opening ratio from being reduced due to the shift register elements provided in the pixel unit, the display panel is preferably an organic light emitting display panel. Specifically, an organic electroluminescent device is provided inside the pixel unit, the shift register elements provided within the pixel unit are located beneath an anode layer of the organic electroluminescent device. The display panel further includes a packaging layer covering the array substrate and a cover plate provided on the packaging layer. When the display panel is an organic light emitting display panel, the cover plate and the array substrate are bonded using an packaging adhesive layer with a high transmittance, without the need for providing a circle of seal agent at the edges of the array substrate, thereby preventing the bezel from being widened due to the seal agent.

As yet another aspect of the present disclosure, there is provided a display device comprising the above display panel. Because the bezel of the above display panel is narrow, the display device has a narrow bezel.

It can be understood that the foregoing implementations are merely exemplary implementations used for describing the principle of the present disclosure, but the present disclosure is not limited thereto. Those of ordinary skill in the art may make various variations and modifications without departing from the spirit and essence of the present disclosure, and these variations and modifications shall fall into the protection scope of the present disclosure.

The invention claimed is:

1. An array substrate, comprising:
   a plurality of pixel units arranged in rows and columns; and
   a plurality of cascaded shift register units, the plurality of shift register units and the rows of pixel units having one-to-one correspondence therebetween, wherein
   each shift register unit comprises a plurality of shift register elements, and for each shift register unit, at least one shift register element in the shift register unit is provided inside at least one pixel unit among the row of pixel units corresponding to the shift register unit,
   wherein the plurality of shift register elements of each shift register unit comprise an input transistor, a pull-up transistor, a storage capacitor, a pull-down transistor and a pull-down control transistor, and the input transistor, the pull-up transistor, the pull-down transistor and the pull-down control transistor are respectively provided inside different pixel units, and
   in a N-th stage shift register unit, a second electrode of the input transistor is connected with a first terminal of the storage capacitor; a gate of the pull-up transistor is connected with the first terminal of the storage capacitor, a first electrode of the pull-up transistor is connected with a clock signal input terminal of the shift register unit, and a second electrode of the pull-up transistor is connected with a N-th gate line of a display region; a second terminal of the storage capacitor is connected with the N-th gate line; a first electrode of the pull-down transistor is connected with the N-th gate line, and a second electrode of the pull-down transistor is connected with a low level input terminal of the shift register unit; a first electrode of the pull-down control transistor is connected with the first terminal of the storage capacitor, and a second electrode of the pull-down control transistor is connected with the low level input terminal of the shift register unit; wherein N is a positive integer.

2. The array substrate according to claim 1, wherein for each shift register unit, all the shift register elements in the shift register unit are provided inside at least one pixel unit among the row of pixel units corresponding to the shift register unit.

3. The array substrate according to claim 2, wherein a number of the shift register elements provided inside a same pixel unit is at most two.

4. The array substrate according to claim 1, wherein an organic electroluminescent device is provided in the pixel unit, and the shift register element provided inside the pixel unit is provided beneath an anode layer of the organic electroluminescent device.

5. The array substrate according to claim 4, further comprising a plurality of signal lines for providing signals to the shift register units, wherein at least one of the signal lines is provided in the display region of the array substrate, and the signal lines are insulated and spaced apart from gate lines of the display region.

6. The array substrate according to claim 5, wherein the signal lines and data lines of the display region are provided in a same layer, the signal lines do not intersect with the data lines, and at most two of the signal lines are provided between any two adjacent data lines.

7. The array substrate according to claim 4, wherein
   when N=1, in a first stage shift register unit, a gate and a first electrode of the input transistor are connected with a frame start signal line for proving a frame start signal, and a gate of the pull-down transistor and a gate of the pull-down control transistor are both connected with a second gate line;
   when N is an integer greater than 1 and smaller than a total number of the shift register units, in the N-th stage shift register unit, the gate and the first electrode of the input transistor are connected with a (N−1)-th gate line, and the gate of the pull-down transistor and the gate of the pull-down control transistor are both connected with a (N+1)-th gate line;
   when N equals the total number of the shift register units, in the N-th stage shift register unit, the gate and the first electrode of the input transistor are connected with a (N−1)-th gate line, and the gate of the pull-down transistor and the gate of the pull-down control transistor are both connected with a reset signal line for providing a reset signal to the N-th stage shift register unit.

8. The array substrate according to claim 1, further comprising a plurality of signal lines for providing signals to the shift register units, wherein at least one of the signal lines is provided in the display region of the array substrate, and the signal lines are insulated and spaced apart from gate lines of the display region.

9. The array substrate according to claim 8, wherein the signal lines and data lines of the display region are provided in a same layer, the signal lines do not intersect with the data lines, and at most two of the signal lines are provided between any two adjacent data lines.

10. The array substrate according to claim 1, wherein
   when N=1, in a first stage shift register unit, a gate and a first electrode of the input transistor are connected with a frame start signal line for proving a frame start signal, and a gate of the pull-down transistor and a gate of the pull-down control transistor are both connected with a second gate line;
   when N is an integer greater than 1 and smaller than a total number of the shift register units, in the N-th stage shift register unit, the gate and the first electrode of the input transistor are connected with a (N−1)-th gate line, and the gate of the pull-down transistor and the gate of the pull-down control transistor are both connected with a (N+1)-th gate line;
   when N equals the total number of the shift register units, in the N-th stage shift register unit, the gate and the first electrode of the input transistor are connected with a (N−1)-th gate line, and the gate of the pull-down transistor and the gate of the pull-down control transistor are both connected with a reset signal line for providing a reset signal to the N-th stage shift register unit.

11. A display panel, comprising the array substrate according to claim 1.

12. The display panel according to claim 11, wherein an organic electroluminescent device is provided in the pixel unit, the shift register element provided inside the pixel unit is provided beneath an anode layer of the organic electroluminescent device; the display panel further comprises a packaging layer covering the array substrate and a cover plate provided on the packaging layer.

13. A display device, comprising the display panel according to claim 12.

14. The display panel according to claim 11, further comprising a plurality of signal lines for providing signals to the shift register units, wherein at least one of the signal lines is provided in the display region of the array substrate, and the signal lines are insulated and spaced apart from gate lines of the display region.

15. The display panel according to claim 14, wherein the signal lines and data lines of the display region are provided in a same layer, the signal lines do not intersect with the data lines, and at most two of the signal lines are provided between any two adjacent data lines.

16. The display panel according to claim 11, wherein
when N=1, in a first stage shift register unit, a gate and a first electrode of the input transistor are connected with a frame start signal line for proving a frame start signal, and a gate of the pull-down transistor and a gate of the pull-down control transistor are both connected with a second gate line;
when N is an integer greater than 1 and smaller than a total number of the shift register units, in the N-th stage shift register unit, the gate and the first electrode of the input transistor are connected with a (N−1)-th gate line, and the gate of the pull-down transistor and the gate of the pull-down control transistor are both connected with a (N+1)-th gate line;
when N equals the total number of the shift register units, in the N-th stage shift register unit, the gate and the first electrode of the input transistor are connected with a (N−1)-th gate line, and the gate of the pull-down transistor and the gate of the pull-down control transistor are both connected with a reset signal line for providing a reset signal to the N-th stage shift register unit.

17. A display device, comprising the display panel according to claim 11.

* * * * *